United States Patent [19]

Jansseune

[11] Patent Number: 5,578,977
[45] Date of Patent: Nov. 26, 1996

[54] PROXIMITY SWITCH WITH THREE SWITCHING POSITIONS

[75] Inventor: Luc Jansseune, Oostende, Belgium

[73] Assignee: Siemens Aktiengesellschaft, Munich, Germany

[21] Appl. No.: 530,876

[22] Filed: Sep. 20, 1995

[30] Foreign Application Priority Data

Sep. 20, 1994 [DE] Germany .......................... 9415257 U

[51] Int. Cl.⁶ ..................................................... H01H 9/00
[52] U.S. Cl. ........................................... 335/207; 335/205
[58] Field of Search ........................................ 335/205–7

[56] References Cited

U.S. PATENT DOCUMENTS 5,233,323  8/1993  Burkett et al. .................... 335/207

FOREIGN PATENT DOCUMENTS 4211486  4/1993  Germany .

*Primary Examiner*—Lincoln Donovan
*Attorney, Agent, or Firm*—Herbert L. Lerner; Laurence A. Greenberg

[57] ABSTRACT

A microswitch with an integrated circuit includes a ferromagnetic tripping body being movable between three switching positions. Two Hall sensors are associated with the tripping body. A permanent magnet being disposed fixedly below the two Hall sensors has one pole facing toward the two Hall sensors for generating field lines penetrating the Hall sensors. A dual evaluation circuit ascertains a ratio of magnetic flux in each of the two Hall sensors, derives a switching signal from a change in the ratio upon an approach of the tripping body and has first and second outputs. The dual evaluation circuit changes a switching state with respect to one of the outputs in reaction to a positive or negative difference in magnetic flux between the two Hall sensors. In this way, an occurrence of a vanishingly small difference, a positive difference and a negative difference in magnetic flux is switched through the three positions of the tripping body.

2 Claims, 1 Drawing Sheet

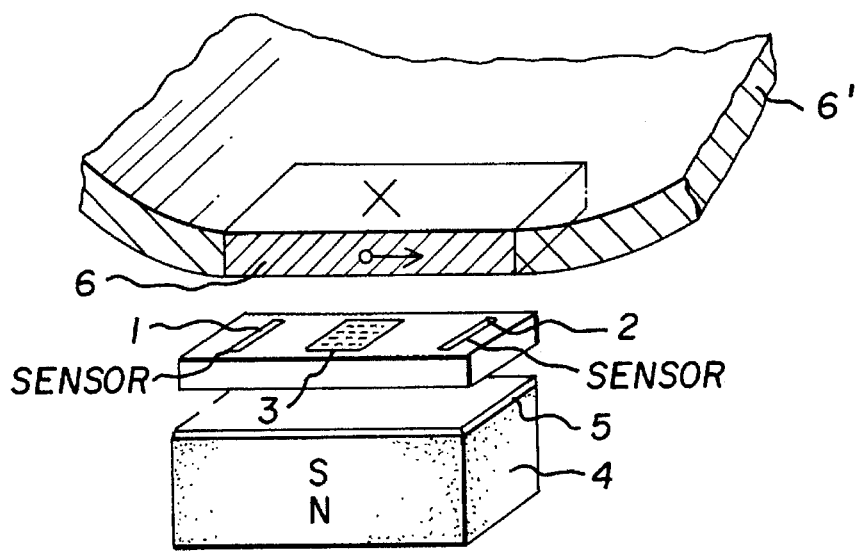
FIG. 1
FIG. 2
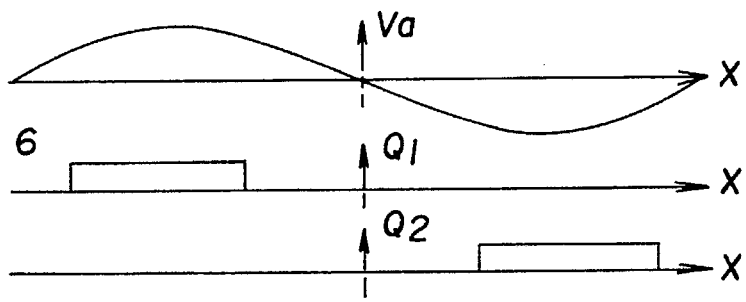
FIG. 3
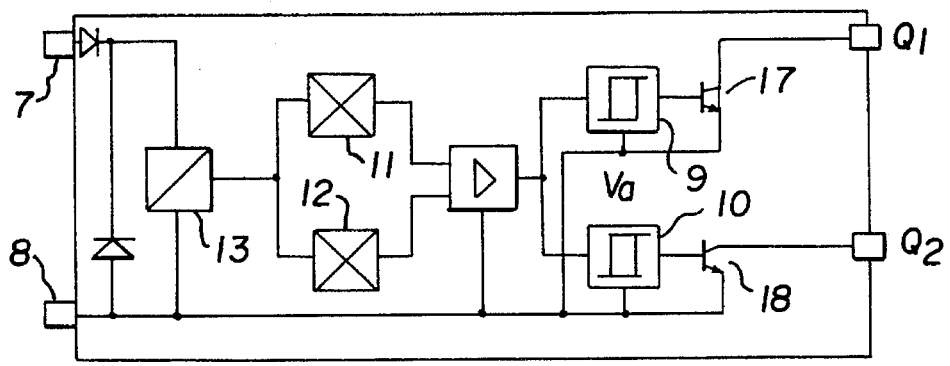

PROXIMITY SWITCH WITH THREE SWITCHING POSITIONS

BACKGROUND OF THE INVENTION

1. Field of the Invention

The invention relates to a microswitch with an integrated circuit, having two Hall sensors, at least one evaluation circuit, and a permanent magnet disposed fixedly below the two Hall sensors, the permanent magnet being oriented with one pole toward the two Hall sensors and having field lines penetrating the Hall sensors, a ratio of magnetic flux in each of the two Hall sensors being ascertained through the evaluation circuit, and a switching signal being derived from a change in the ratio upon an approach of a ferromagnetic tripping body.

One such proximity switch is already known from German Patent DE 42 11 486. However, that switch is constructed as an on/off switch.

2. Summary of the Invention

It is accordingly an object of the invention to provide a proximity switch with three switching positions, which overcomes the hereinafore-mentioned disadvantages of the heretofore-known devices of this general type and with which the status of a lock cylinder in a motor vehicle door is to be sampled for a central locking system. Three states which are to be detected are: cylinder in repose, rotated to the left and rotated to the right (opening or closing of the vehicle doors).

With the foregoing and other objects in view there is provided, in accordance with the invention, a microswitch with an integrated circuit, comprising a ferromagnetic tripping body being movable between three switching positions; two Hall sensors being associated with the tripping body; a permanent magnet disposed fixedly below the two Hall sensors, the permanent magnet having one pole facing toward the two Hall sensors for generating field lines penetrating the Hall sensors; and a dual evaluation circuit for ascertaining a ratio of magnetic flux in each of the two Hall sensors and for deriving a switching signal from a change in the ratio upon an approach of the tripping body, the dual evaluation circuit having first and second outputs, and the dual evaluation circuit changing a switching state with respect to one of the outputs in reaction to a positive or negative difference in magnetic flux between the two Hall sensors, for switching an occurrence of a vanishingly small difference, a positive difference and a negative difference in magnetic flux through the three positions of the tripping body.

In accordance with a concomitant feature of the invention, the tripping body is secured to a lock cylinder of a motor vehicle door; the tripping body is located centrally above the two Hall sensors in a position of repose of the lock cylinder; and by rotation of the lock cylinder the tripping body can be brought into an eccentric position relative to the two Hall sensors, so that three respective switching positions of the microswitch correspond to the lock cylinder in a position of repose, in a position rotated to the left and in a position rotated to the right.

Other features which are considered as characteristic for the invention are set forth in the appended claims.

Although the invention is illustrated and described herein as embodied in a proximity switch with three switching positions, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, exploded, perspective view of proximity switch;

FIG. 2 is a diagram showing a dependency of magnetic flux on a position of a tripping body; and FIG. 3 is a block circuit diagram of a dual evaluation circuit that can be used in a switch according to the invention.

DESCRIPTION OF THE PREFERRED EMBODIMENTS

Referring now to the figures of the drawing in detail and first, particularly, to FIG. 1 thereof, there are seen essential components of a proximity switch.

As in the case of gear wheel sensors, evaluation electronics 3 are present in the form of a Hall-difference IC which is mounted above a permanent magnet 4 with a homogenizing plate, platelet or lamina 5. One of the two poles S, N of the permanent magnet 4 faces toward the two Hall sensors 1, 2, and its field lines penetrate the Hall sensors. A ferromagnetic object (such as a stamped metal plate) is secured to a lock cylinder 6' and is in a position of repose (that is, in a middle position), centrally above two Hall generators 1, 2. If the lock cylinder 6' is turned, then a tripping portion or object 6 is moved to an eccentric position along an X-axis, as compared with the Hall-difference IC 3 (x<>0). In this position, a difference in magnetic flux between the two Hall generators 1, 2 is picked up.

An amount Q1 or Q2 of the magnetic flux difference of the Hall sensors 1 or 2, respectively, is positive or negative along the X-axis, depending on whether the tripping part or object 6 is eccentrically to the left or to the right, as is illustrated in FIG. 2, thus generating a switching signal Va.

In order to enable evaluation of this left and right position, the IC 3 must be provided with two Schmitt triggers and two output stages, as is shown in FIG. 3. It is seen from FIG. 3 that diodes 7, 8 at inputs lead to a reference circuit 13 which is in turn connected to Mall sensors 11, 12. Amplifiers 9, 10 lead from the Hall sensors 11, 22, through transistors 17, 18 to outputs for the amounts Q1 and Q2 of the magnetic flux difference.

Through the use of the proximity switch with three positions in accordance with the invention, switching intervals up to 3.5 mm can be attained.

I claim:

1. A microswitch with an integrated circuit, comprising:
   a ferromagnetic tripping body being movable between three switching positions;
   two Hall sensors being associated with said tripping body;
   a permanent magnet disposed fixedly below said two Hall sensors, said permanent magnet having one pole facing toward said two Hall sensors for generating field lines penetrating said Hall sensors; and a dual evaluation circuit for ascertaining a ratio of magnetic flux in each of said two Hall sensors and for deriving a switching signal from a change in said ratio upon an approach of said tripping body, said dual evaluation circuit having first and second outputs, and said dual evaluation circuit changing a switching state with respect to one of said outputs in reaction to a positive or negative difference in magnetic flux between said two Hall sensors, for switching an occurrence of a vanishingly small difference, a positive difference and a negative difference in magnetic flux through said three positions of said tripping body.

2. The microswitch according to claim 1, wherein:

said tripping body is secured to a motor vehicle door lock cylinder having a position of repose, a position rotated to the left and in a position rotated to the right;

said tripping body is disposed centrally above said two Hall sensors in the position of repose of the lock cylinder; and rotation of the lock cylinder brings said tripping body into an eccentric position relative to said two Hall sensors, causing three respective switching positions of the microswitch to correspond to the three positions of the lock cylinder.

* * * * *